(12) United States Patent
Yang et al.

(10) Patent No.: US 7,634,040 B1
(45) Date of Patent: Dec. 15, 2009

(54) LOOP LATENCY COMPENSATED PHASE-LOCKED LOOP

(75) Inventors: Meng-Ta Yang, Miaoli County (TW); Ping-Ying Wang, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 534 days.

(21) Appl. No.: 11/556,725

(22) Filed: Nov. 6, 2006

(51) Int. Cl.
*H04L 7/00* (2006.01)
(52) U.S. Cl. ..................... 375/376; 375/355
(58) Field of Classification Search ............ 375/355, 375/371, 373, 376
See application file for complete search history.

(56) References Cited

U.S. PATENT DOCUMENTS 6,236,343 B1   5/2001   Patapoutian

2003/0128451 A1*   7/2003   Ohta et al. ............ 360/51
2007/0028059 A1*   2/2007   Gregorius ............ 711/154

OTHER PUBLICATIONS

"An Improved Delay Compensation Technique for Digital Clock Recovery Loops" Fulvio Spagna, 2001; pp. 1395-1398.

* cited by examiner

*Primary Examiner*—David B Lugo
(74) *Attorney, Agent, or Firm*—Thomas, Kayden, Horstemeyer & Risley (57) ABSTRACT

A loop latency compensated phase-locked loop (PLL). The loop latency compensated PLL comprises an ADC, a phase detector, a loop filter and a VCO. The ADC receives an analog input signal and an output clock to generate a digital signal. The phase detector receives the digital signal to generate an estimated phase error. The loop filter receives the estimated phase error to generate a latency compensated phase error output signal with a phase assigned by a sign-bit of the received estimated phase error. The VCO generates the output clock in response to the latency compensated phase error output signal and feeds the output clock back to the ADC.

10 Claims, 9 Drawing Sheets

LOOP LATENCY COMPENSATED PHASE-LOCKED LOOP

BACKGROUND OF THE INVENTION

1. Field of the Invention

The invention relates to phase-locked loop circuits (PLLs), and more specifically to a phase-locked loop with compensated loop latency.

2. Description of the Related Art

With increased clock rates, low-skew clock distributions are becoming increasingly critical to achieving design speed objectives. High-speed circuits may also require clocks with programmable duty cycle and delay. For all these applications, a comprehensive clock management may be employed on a chip. The phase-locked loop circuits (PLLs) are widely used to achieve low clock skew distributions and stringent frequency requirements.

Figure 1:
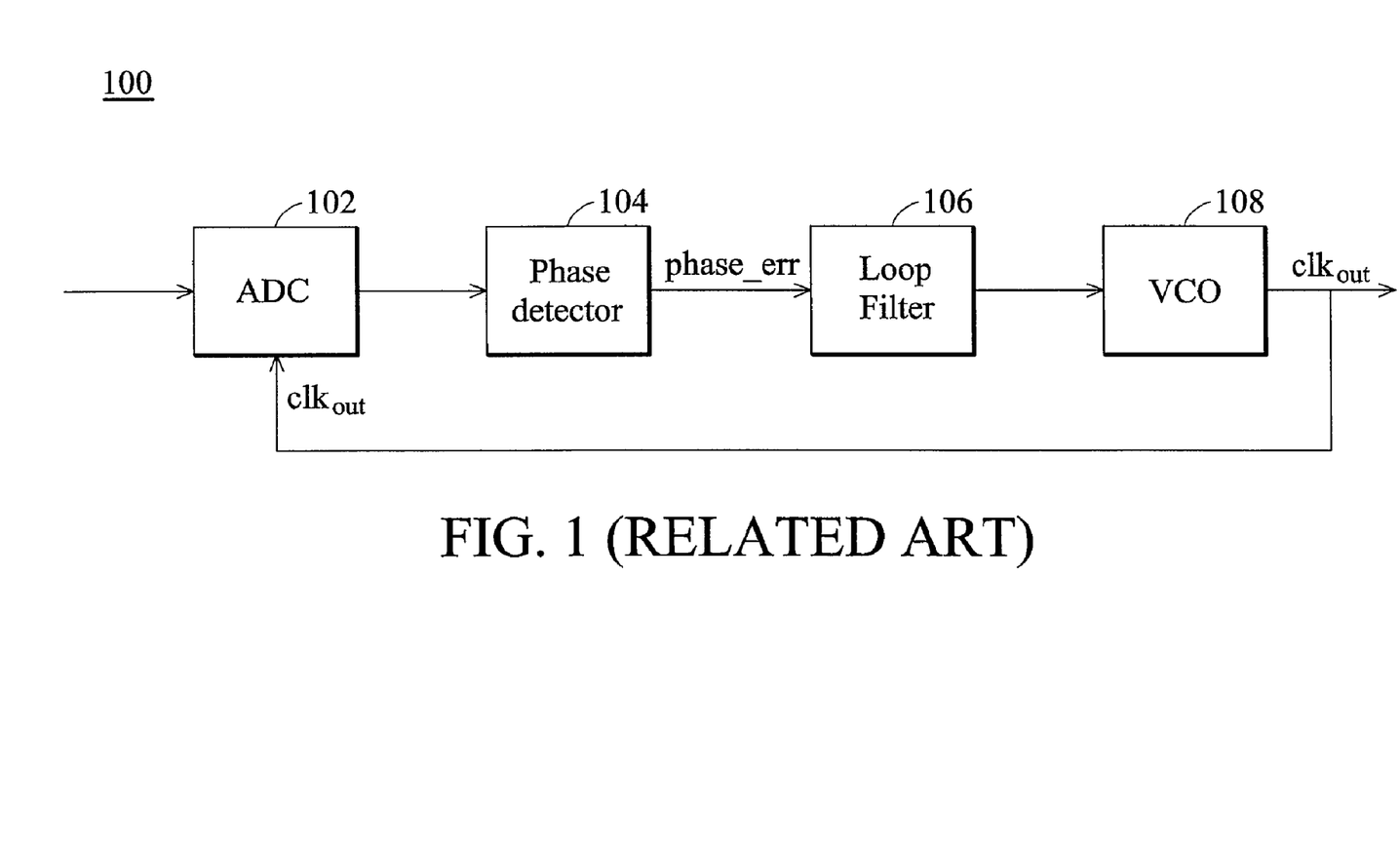
FIG. 1 is a schematic diagram of a conventional PLL.

FIG. 1 is a schematic diagram of a conventional PLL 100. The PLL 100 comprises an analog-to-digital converter (ADC) 102, a phase detector 104, a loop filter 106 and a voltage-controlled oscillator (VCO) 108. The ADC 102 receives an analog input signal and an output clock $clk_{out}$ functioning as a clock for the ADC 102 to generate a digital signal to the phase detector 104. The phase detector 104 generates an estimated phase error phase_err according to the received digital signal from the ADC 102. The loop filter 106, such as a proportional integral (PI) filter, operates as an integrator to generate a filtered signal to the VCO 108 according to the estimated phase error phase_err received from the phase detector 104. The VCO 108 then generates the output clock $clk_{out}$ adjusted by the filtered signal. In addition to acting as the output signal of PLL 100, the output clock $clk_{out}$ is fed back to the ADC 102 as stated, forming the closed-loop PLL circuit.

However, loop latency may be introduced in the PLL circuits, causing instability and degrading performance thereof. Thus, it is advantageous to compensate the effects caused by the loop latency in PLLs, obtaining a loop latency compensated PLL.

BRIEF SUMMARY OF THE INVENTION

A detailed description is given in the following embodiments with reference to the accompanying drawings.

The invention is generally directed to a loop latency compensated phase-locked loop (PLL). An exemplary embodiment of a loop latency compensated PLL comprises an analog-to-digital converter (ADC), a phase detector, a loop filter and a voltage-controlled oscillator (VCO). The ADC receives an analog input signal and an output clock to generate a digital signal. The phase detector, coupled to the ADC, receives the digital signal to generate an estimated phase error. The loop filter, coupled to the phase detector, receives the estimated phase error to generate a latency compensated phase error output signal with a phase assigned by a sign-bit of the received estimated phase error. The VCO, coupled to the loop filter, generates the output clock in response to the latency compensated phase error output signal and feeds the output clock back to the ADC.

Another loop latency compensated PLL is provided. The loop latency compensated PLL comprises an ADC, a phase detector, a latency compensator, a loop filter and a VCO. The ADC receives an analog input signal and an output clock to generate a digital signal. The phase detector, coupled to the ADC, receives the digital signal to generate an estimated phase error. The latency compensator, coupled to the phase detector, provides a phase correction on the estimated phase error to generate a latency correcting signal. The loop filter, coupled to the latency compensator, receives the latency correcting signal to generate a filtered signal. The VCO, coupled to the loop filter, generates the output clock in response to the filtered signal and feeds the output clock back to the ADC.

A phase-locked loop (PLL) capable of switching between high speed and low speed operating modes is further provided. The PLL comprises an ADC, a phase detector, a loop filter and a VCO. The ADC receives an analog input signal and an output clock to generate a digital signal. The phase detector, coupled to the ADC, switches between high speed and low speed operating modes in response to a control signal to generate an estimated phase error in accordance with the digital signal. The loop filter, coupled to the phase detector, receives the estimated phase error to generate a filtered signal. The VCO, coupled to the loop filter, generates the output clock in response to the filtered signal and feeds the output clock back to the ADC.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
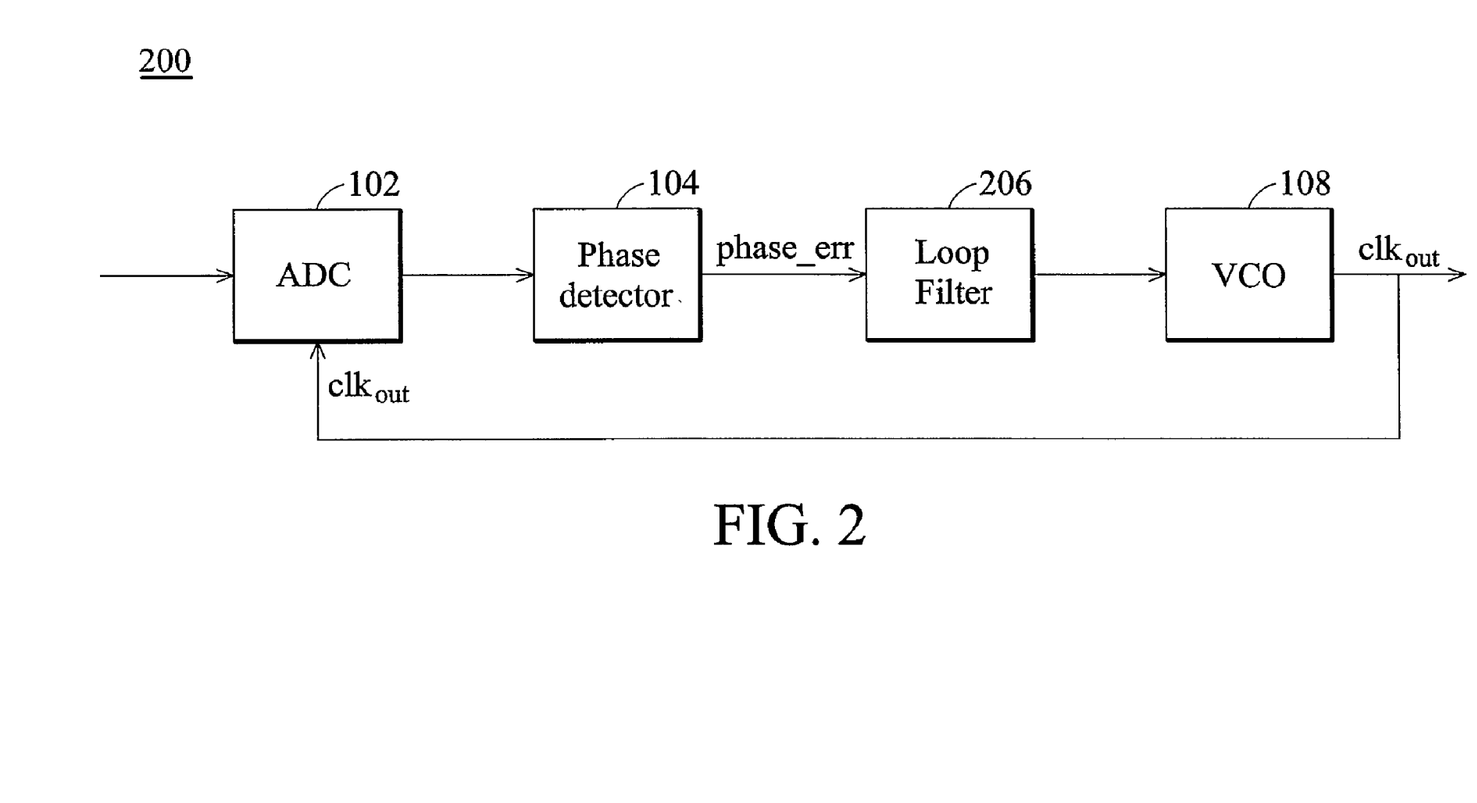
FIG. 2 is a schematic diagram of a loop latency compensated PLL according to an embodiment of the invention.
Figure 3A:
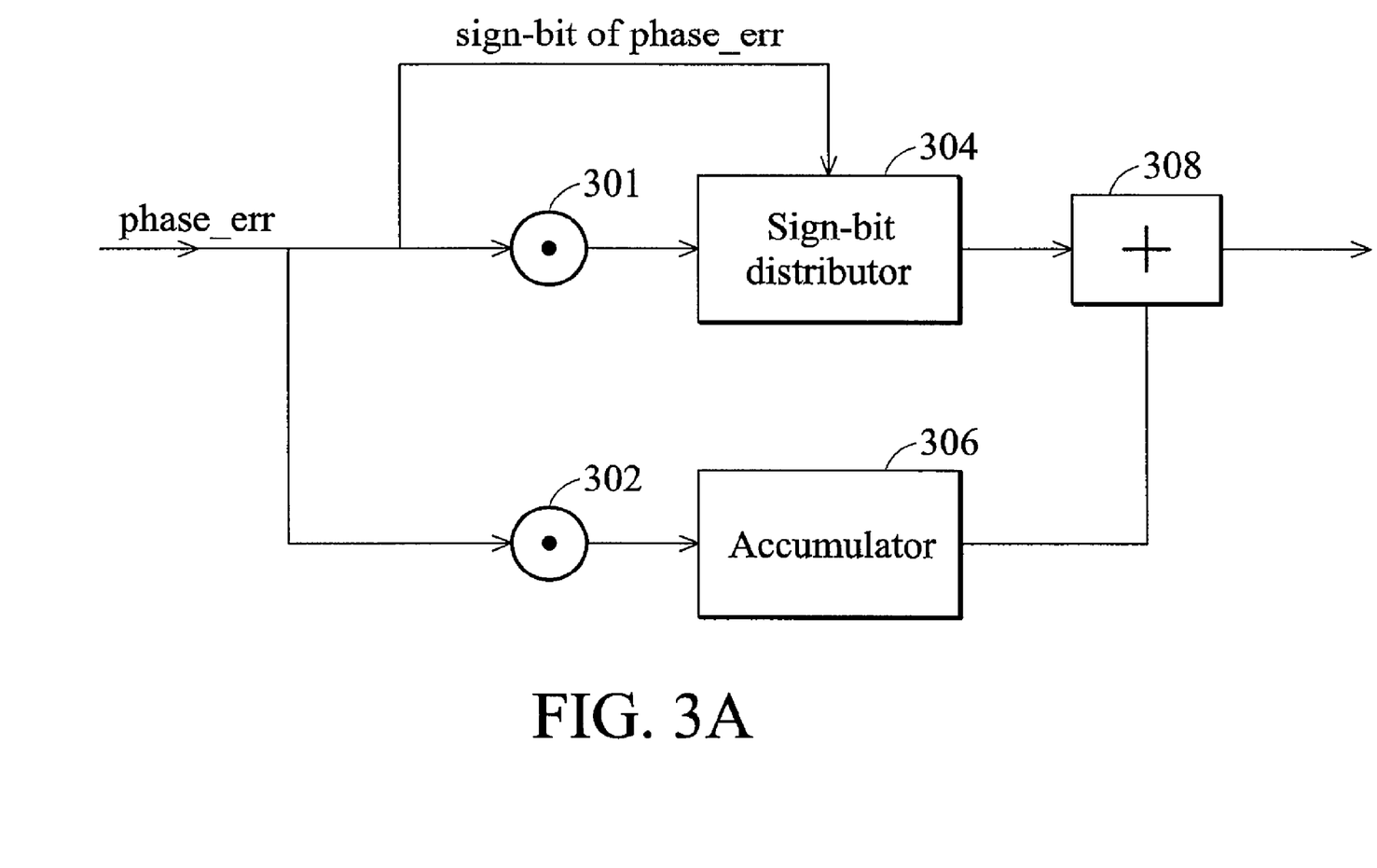
FIGS. 3A and 3B are schematic diagrams of the loop filter in FIG. 2.
Figure 3B:
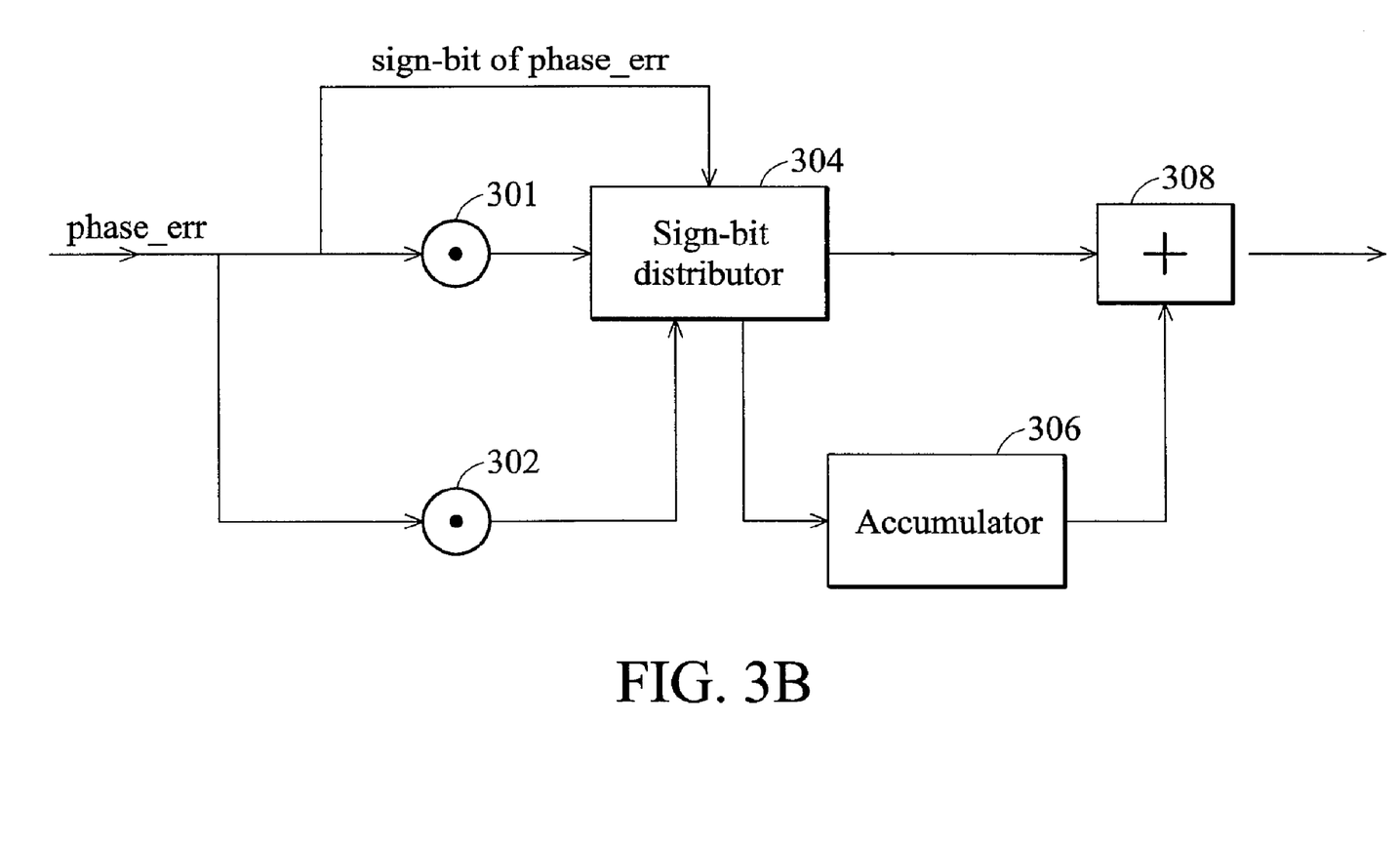

FIG. 2 is a schematic diagram of a loop latency compensated PLL 200 according to an embodiment of the invention, comprising an analog-to-digital converter (ADC) 102, a phase detector 104, a loop filter 206 and a voltage-controlled oscillator (VCO) 108. FIG. 2 uses the same numerals as FIG. 1 which perform the same function, and thus are not described in further detail. The loop filer 206 receives the estimated phase error phase_err from the phase detector 104 and generates a latency compensated phase error output signal with a phase assigned by a sign-bit of the received estimated phase error phase_err. FIG. 3A shows an exemplary loop filter 206 of FIG. 2. The loop filter 206 in FIG. 3A comprises two multipliers 301 and 302, a sign-bit distributor 304, an accumulator 306 and an adder 308. The multipliers 301 and 302 receive the estimated phase error phase_err and respectively apply a proportional gain thereto. The sign-bit distributor 304, coupled to the multiplier 301, receives an output thereof and the estimated phase error phase_err to replace a sign-bit of the output of the multiplier 301 with the sign-bit of the estimated phase error phase_err, generating a latency compensated signal. The accumulator 306, coupled to the multiplier 302, integrates an output thereof to generate an accumulated signal. The adder 308, coupled to the sign-bit distributor 304 and accumulator 306, sums the latency compensated signal and accumulated signal to generate the latency compensated phase error output signal to the VCO 108. Since the sign-bit of the estimated phase error phase_err contains the most important information thereof, reserving the sign-bit of the estimated phase error phase_err may compensate the effects caused by the loop latency of the loop latency compensated PLL 200. FIG. 3B shows another exemplary loop filter 206 of FIG. 2. FIG. 3B is similar to the loop filer 206 shown in FIG. 3A, except that like the output of the multiplier 301, the output of the multiplier 302 is also applied to the sign-bit distributor 304, replacing the sign-bit thereof with that of the estimated phase error phase_err and then output to the accumulator 306.

Figure 4:
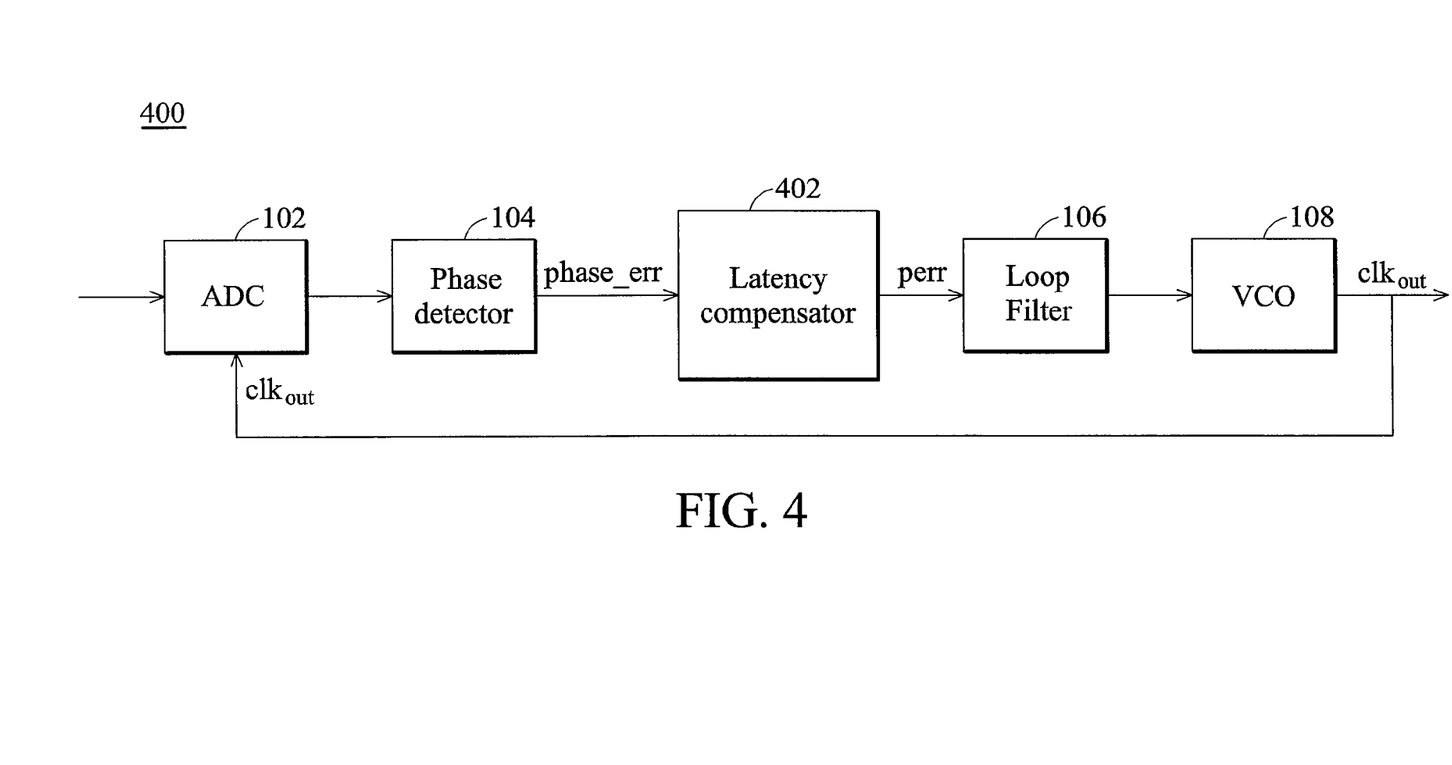
FIG. 4 is a schematic diagram of a loop latency compensated PLL according to another embodiment of the invention.

According to an embodiment of the invention shown in FIG. 2, the effects of the loop latency of PLLs are compensated by reserving the sign-bit of the estimated phase error phase_err generated by the phase detector 104. However, the loop latency effects can be compensated in other ways. FIG. 4 shows a loop latency compensated PLL 400 according to another embodiment of the invention, comprising an ADC 102, a phase detector 104, a latency compensator 402, a loop filter 106 and a VCO 108. The loop latency compensated PLL 400 is similar to the conventional PLL 100 shown in FIG. 1 except that a latency compensator 402 is disposed between the phase detector 104 and loop filter 106. The latency compensator 402 receives the estimated phase error phase_err from the phase detector 104 and provides phase correction thereon to generate a latency correcting signal to the loop filter 106. The latency compensator 402 provides the phase correction according to the possible phase error in conventional PLLs generated in each circuit block thereof. By subtracting the possible phase error from the estimated phase error phase_err in advance in the latency compensator 402, the latency effects caused thereby can be compensated. The possible phase error in conventional PLLs is described in the following formula.

$$\text{phase\_error}(n) \cong G \cdot \sum_{i=0}^{N-1} perr(n-i);$$

wherein N represents the overall latency in the PLL 400, signal perr is the latency correcting signal generated by the latency compensator 402 and G represents a phase correction gain.

Figure 5:
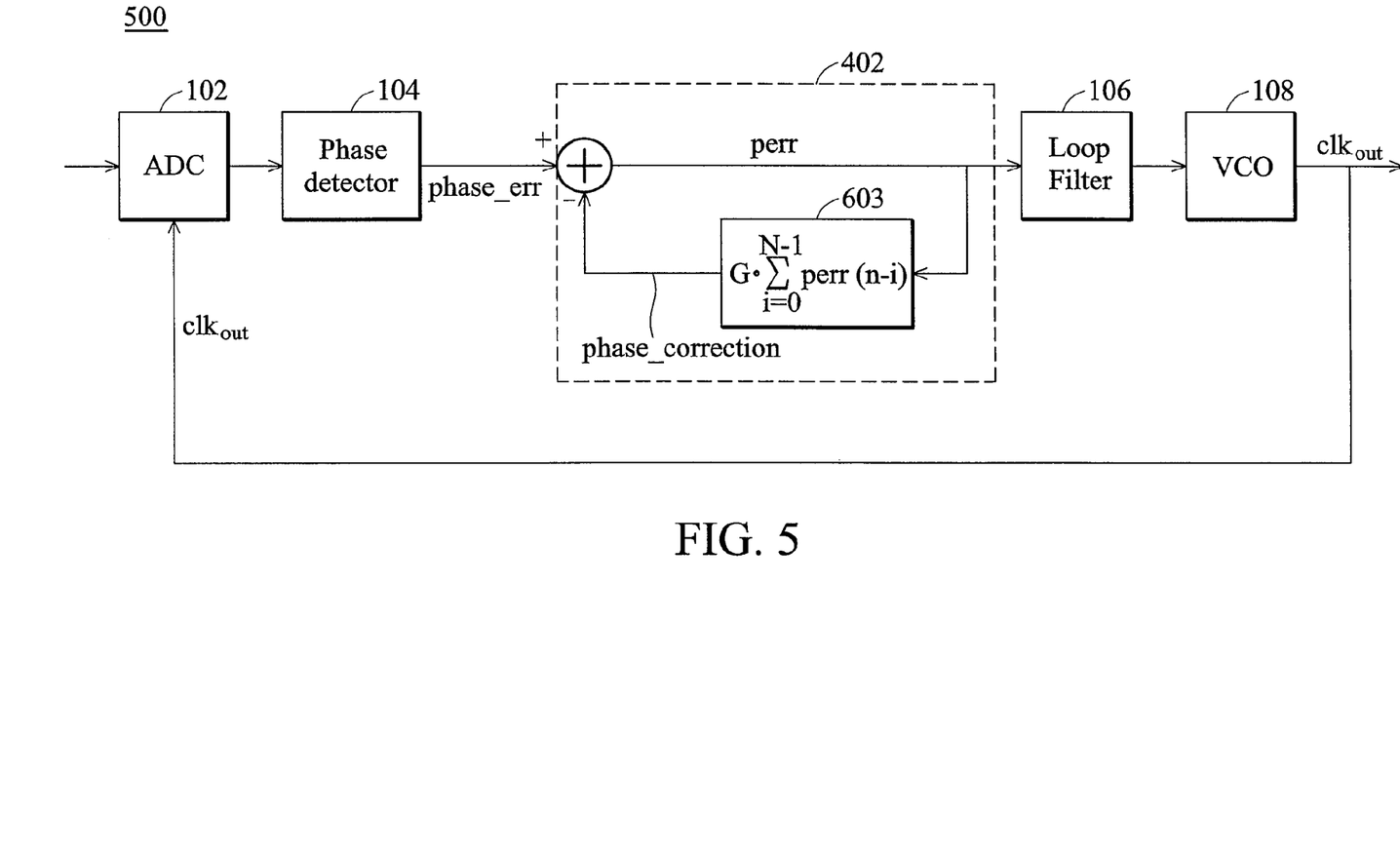
FIG. 5 is a schematic diagram of the loop latency compensated PLL in FIG. 4.
Figure 6:
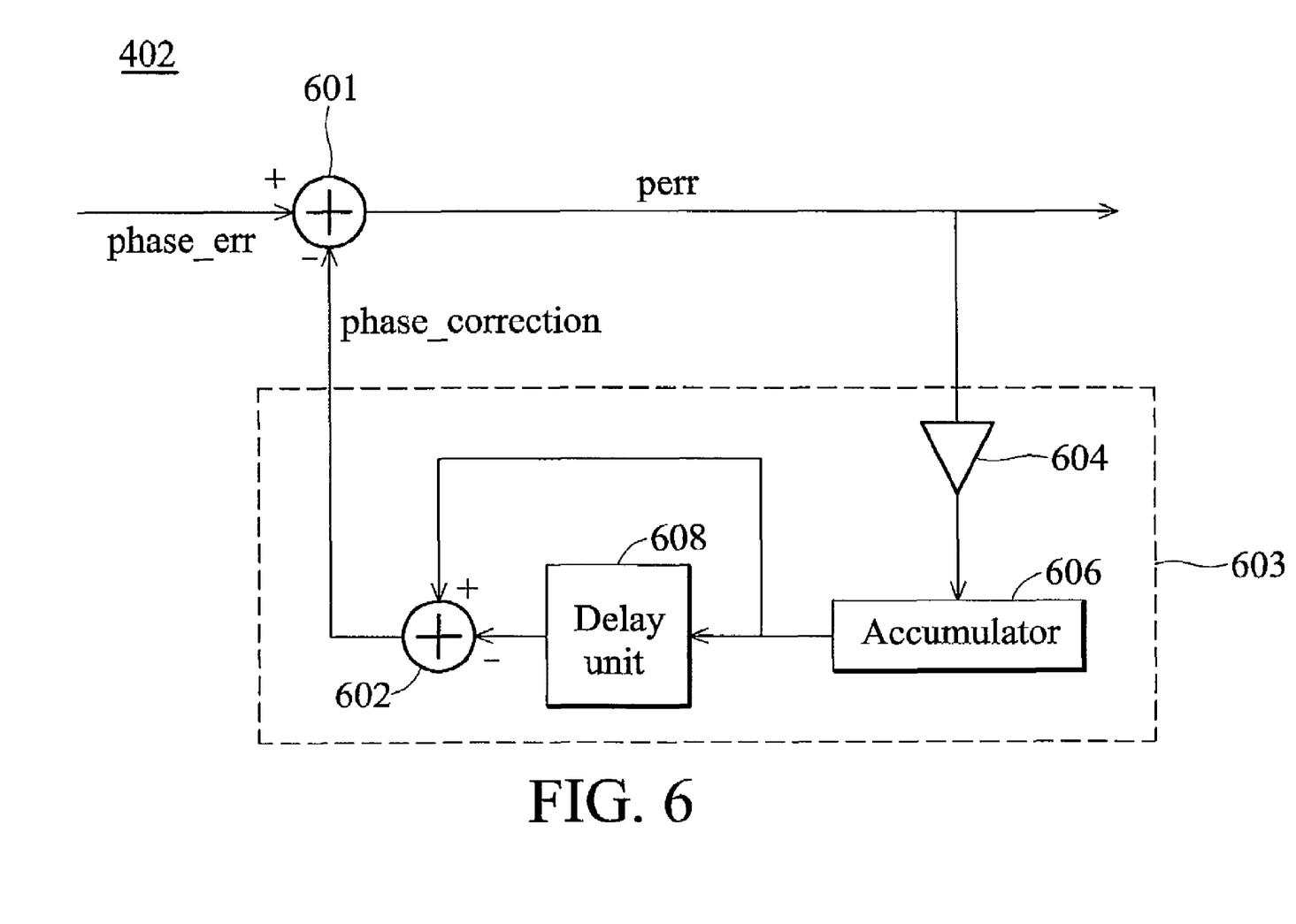
FIG. 6 is a schematic diagram of the loop compensator in FIG. 5.

As shown in FIG. 5, the phase error is corrected in the latency compensator 402 by subtracting a correction feedback signal phase_correction representing the possible phase error shown in the formula from the received estimated phase error phase_err. FIG. 6 shows the latency compensator 402 in FIG. 5. The latency compensator 402 comprises summer 601 and phase error estimator 603 that, in FIG. 6, includes summer 602, a multiplier 604, an accumulator 606 and a delay unit 608. Summer 601 receives the estimated phase error phase_err and the correction feedback signal phase_correction to generate the latency correcting signal perr corresponding to a difference therebetween. The multiplier 604 receives the latency correcting signal perr to apply the phase correction gain G thereon and generates a multiplied signal. The accumulator 606, coupled to the multiplier 604, accumulates the multiplied signal to generate an accumulated signal. The delay unit 608 receives the accumulated signal from the accumulator 606 and generates a delayed signal. The delayed signal is a NT time-delayed version of the accumulated signal, where N is the loop latency and T is the clock period of the loop latency compensated PLL 400. The summer 602, coupled to the accumulator 606 and delay unit 608, subtracts the delayed signal from the accumulated signal to generate the correction feedback signal phase_correction to the summer 601. It is noted the phase correction gain G is preferably equal to or less than the closed-loop gain of the PLL 400. If the gain of other circuit blocks in PLL 400 except loop filter 106 is 1, the phase correction gain G equals to the gain of the loop filer 106.

Phase error estimator 603 can be also implemented by a finite impulse response (FIR) filter that receives latency correcting signal perr and executes the operation required in the formula to generate correction feedback signal phase_correction.

Figure 7:
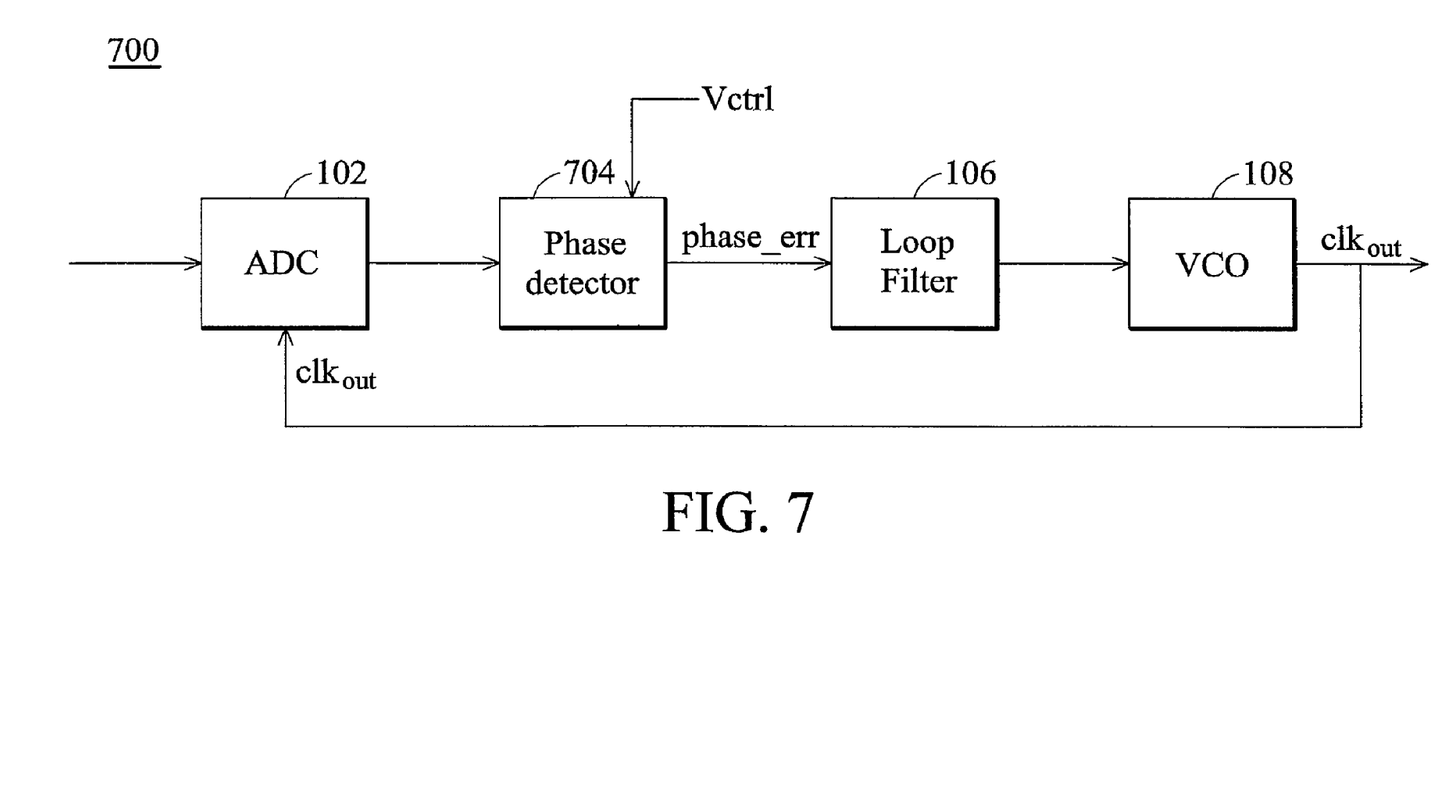
FIG. 7 is a schematic diagram of a PLL according to another embodiment of the invention.
Figure 8:
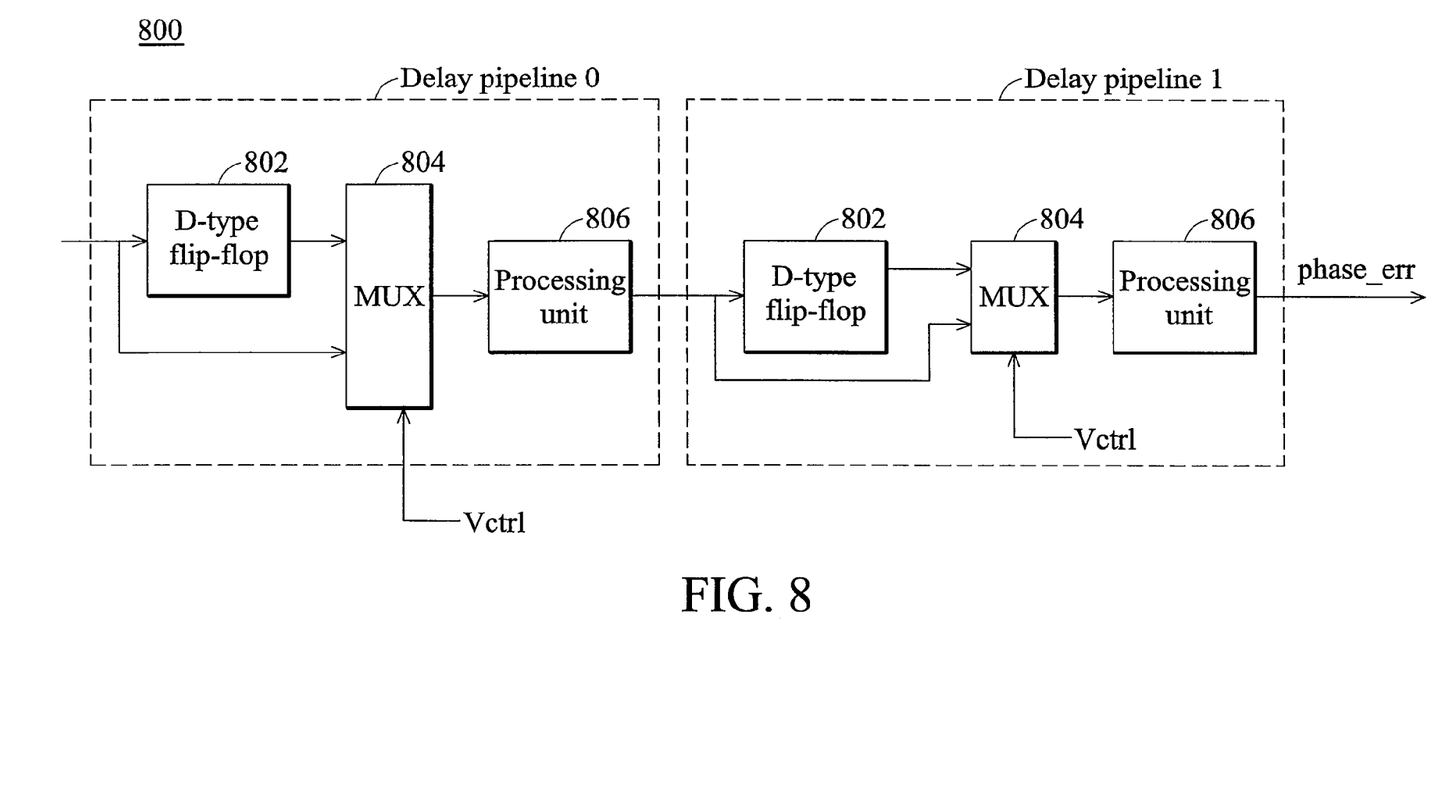
FIG. 8 is a schematic diagram of the phase detector in FIG. 7.

Conventional PLL generally comprises a plurality of delay pipelines to meet frequency requirements of high speed applications. However, when employed in low speed application, it is not necessary to adopt all the delay pipelines thereof, increasing loop latency and thus degrading performance. Hence, an embodiment of the invention provides a PLL capable of switching between high speed and low speed operating modes, fulfilling different speed requirements. FIG. 7 shows a PLL 700 capable of switching between high speed and low speed operating modes according to another embodiment of the invention, comprising an ADC 102, a phase detector 704, a loop filter 206 and a VCO 108. The PLL 700 is similar to the PLL 100 shown in FIG. 1 except the phase detector 704. FIG. 7 uses the same numerals as FIG. 1 which perform the same function, and thus are not described in further detail. The phase detector 704, coupled to the ADC 102, switches between high speed and low speed operating modes in response to a control signal Vctrl to generate an estimated phase error phase_err in accordance with the digital signal from the ADC 102. FIG. 8 is a schematic diagram of the phase detector 704 in FIG. 7. The phase detector 704 comprises a plurality of delay pipelines, each having an output coupled to an input of a next sequential delay pipeline. As shown, the exemplary phase detector 704 comprises two delay pipelines 0 and 1; however, it may comprise more than two delay pipelines. The delay pipeline 0 receives the digital signal from the ADC 102 and applies its output to the delay pipeline 1, generating the estimated phase error phase_err. Each delay pipeline 0 and 1 comprises a D-type flip-flop 802, a multiplexer 804 and a processing unit 806. The D-type flip-flop 802 receives a pipeline input signal to generate an output signal. The multiplexer 804, coupled to the D-type flip-flop 802, receives the pipeline input signal, output signal and control signal Vctrl to selectively output one of the pipeline input signal and output signal in response to the control signal Vctrl. The processing unit 806, coupled to the multiplexer 804, generates a pipeline output signal according to one of the pipeline input signal and output signal. Thus, the phase detector 704 is able to skip the D-type flip-flop of delay pipelines with the control signal Vctrl according application speed required. It is noted that the output signal is applied to a next delay pipeline or as the estimated phase error phase_err to the loop filter 106 if there is no next delay pipeline. Moreover, in the delay pipeline 0, the pipeline input signal thereof is the digital signal from the ADC 102 when in the delay pipeline 1, the pipeline input signal thereof is the output signal of the last pipeline, i.e. the delay pipeline 0. The control signal Vctrl may be input to allow the PLL 700 to switch between high speed and low speed operating modes according to application speed necessity, adjusting loop latency caused by delay pipelines thereof. Further, the PLL 700 can be applied in disk drives, such as DVD players.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A loop latency compensated phase-locked loop (PLL) comprising:
    an analog-to-digital converter (ADC) receiving an analog input signal and an output clock to generate a digital signal;
    a phase detector coupled to the ADC, receiving the digital signal to generate an estimated phase error;
    a loop filter coupled to the phase detector, receiving the estimated phase error to generate a latency compensated phase error output signal with a phase assigned by a sign-bit of the received estimated phase error, comprising:
        a first multiplier receiving the estimated phase error to apply a first proportional gain thereon; and
        a sign-bit distributor coupled to the first multiplier, receiving the estimated phase error and replacing a sign-bit of the output of the first multiplier with the sign-bit of the estimated phase error to generate a latency compensated signal; and
    a voltage-controlled oscillator (VCO) coupled to the loop filter, generating the output clock in response to the latency compensated phase error output signal and feeding the output clock back to the ADC.

2. The loop latency compensated PLL as claimed in claim 1, wherein the loop filter is a proportional integral filter (PI filter).

3. The loop latency compensated PLL as claimed in claim 1, wherein the loop filter further comprises:
    a second multiplier receiving the estimated phase error to apply a second proportional gain thereon;
    an accumulator coupled to the second multiplier, integrating the output of the second multiplier to generate an accumulated signal; and
    an adder, coupled to the sign-bit distributor and accumulator, summing the latency compensated signal and accumulated signal to generate the latency compensated phase error output signal.

4. The loop latency compensated PLL as claimed in claim 1, wherein the loop filter further comprises:
    a second multiplier receiving the estimated phase error to apply a second proportional gain thereon;
    the sign-bit distributor coupled to both the first and second multipliers, receiving the estimated phase error and replacing sign-bits of the outputs of the first and second multipliers with the sign-bit of the estimated phase error to generate first and second latency compensated signals respectively;
    an accumulator coupled to the sign-bit distributor, integrating the second latency compensated signal to generate an accumulated signal; and
    an adder, coupled to the sign-bit distributor and the accumulator, summing the first latency compensated signal and accumulated signal to generate the latency compensated phase error output signal.

5. A loop latency compensated phase-locked loop (PLL) comprising:
    an analog-to-digital converter (ADC) receiving an analog input signal and an output clock to generate a digital signal;
    a phase detector coupled to the ADC, receiving the digital signal to generate an estimated phase error;
    a latency compensator coupled to the phase detector, providing a phase correction of the estimated phase error to generate a latency correcting signal, comprising:
        a first summer receiving the estimated phase error and a correction feedback signal to generate the latency correcting signal corresponding to a difference therebetween; and
        a FIR (Finite Impulse Response) filter, receiving the latency correcting signal to generate the correction feedback signal;
    a loop filter coupled to the latency compensator, receiving the latency correcting signal to generate a filtered signal; and
    a voltage-controlled oscillator (VCO) coupled to the loop filter, generating the output clock in response to the filtered signal and feeding the output clock back to the ADC.

6. The loop latency compensated PLL as claimed in claim 5, wherein the FIR filter comprises:
    a multiplier receiving the latency correcting signal to apply a phase correction gain thereon and generating a multiplied signal;
    an accumulator accumulating the multiplied signal to generate an accumulated signal;
    a delay unit receiving the accumulated signal and generating a delayed signal; and
    a second summer coupled to the accumulator and the delay unit, receiving the accumulated signal and the delayed signal to generate the correction feedback signal corresponding to a difference therebetween to the first summer.

7. The loop latency compensated PLL as claimed in claim 6, wherein the phase correction gain is less than or equal to a closed-loop gain of the loop latency compensated PLL.

8. The loop latency compensated PLL as claimed in claim 6, wherein the delayed signal is a NT time-delayed version of the accumulated signal, where N is a loop latency and T is the clock period of the loop latency compensated PLL.

9. A phase-locked loop (PLL) capable of switching between high speed and low speed operating modes, comprising:
    an analog-to-digital converter (ADC) receiving an analog input signal and an output clock to generate a digital signal;
    a phase detector coupled to the ADC, switching between high speed and low speed operating modes in response to a control signal to generate an estimated phase error in accordance with the digital signal, and comprising a plurality of delay pipelines, wherein each delay pipeline has an output coupled to an input of a next sequential delay pipeline and one of the delay pipelines comprises:
        a D-type flip-flop receiving a pipeline input signal to generate an output signal; and
        a multiplexer coupled to the D-type flip-flop, receiving the pipeline input signal, output signal and control signal to selectively output one of the pipeline input signal and output signal in response to the control signal;

a loop filter coupled to the phase detector, receiving the estimated phase error to generate a filtered signal; and a voltage-controlled oscillator (VCO) coupled to the loop filter, generating the output clock in response to the filtered signal and feeding the output clock back to the ADC;

wherein the PLL is embodied and applied in a disk drive.

10. The PLL as claimed in claim 9, wherein one of the delay pipelines further comprises:

a processing unit coupled to the multiplexer, generating a pipeline output signal according to the output of the multiplexer.

* * * * *

UNITED STATES PATENT AND TRADEMARK OFFICE
CERTIFICATE OF CORRECTION

PATENT NO. : 7,634,040 B1
APPLICATION NO. : 11/556725
DATED : December 15, 2009
INVENTOR(S) : Yang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 573 days.

Signed and Sealed this

Ninth Day of November, 2010

David J. Kappos
*Director of the United States Patent and Trademark Office*